United States Patent
Braeckelmann et al.

(10) Patent No.: US 6,218,302 B1
(45) Date of Patent: *Apr. 17, 2001

(54) METHOD FOR FORMING A SEMICONDUCTOR DEVICE

(75) Inventors: Gregor Braeckelmann; Ramnath Venkatraman; Matthew Thomas Herrick; Cindy R. Simpson; Robert W. Fiordalice, all of Austin; Dean J. Denning, Del Valle; Ajay Jain; Cristiano Capasso, both of Austin, all of TX (US)

(73) Assignee: Motorola Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/121,068

(22) Filed: Jul. 21, 1998

(51) Int. Cl.[7] .................................................. H01L 21/44
(52) U.S. Cl. ...................... 438/687; 438/637; 438/638; 438/644; 438/648; 438/653; 438/654; 438/658; 438/660; 438/666; 438/672
(58) Field of Search .............................. 438/687, 622–24, 438/637, 638, 652, 643, 644, 648, 653, 654, 658, 660, 661, 666, 667, 668, 669, 672

(56) References Cited

U.S. PATENT DOCUMENTS

| | | | |
|---|---|---|---|
| 5,063,169 | 11/1991 | De Bruin et al. | 437/41 |
| 5,130,274 | 7/1992 | Harper et al. | 437/195 |
| 5,169,680 | 12/1992 | Ting et al. | 427/96 |
| 5,243,222 | 9/1993 | Harper et al. | 257/774 |
| 5,391,517 | * | 2/1995 | Gelatos et al. | 437/190 |
| 5,622,608 | 4/1997 | Lanford et al. | 204/192.15 |
| 5,674,787 | 10/1997 | Zhao et al. | 437/230 |
| 5,677,244 | * | 10/1997 | Venkatraman | 437/198 |
| 5,747,360 | 5/1998 | Nulman | 437/189 |
| 5,821,168 | * | 10/1998 | Jain | 438/692 |
| 5,824,599 | * | 10/1998 | Schacham-Diamand et al. | 438/678 |
| 5,891,513 | * | 4/1999 | Dubin et al. | 427/98 |
| 5,933,758 | * | 8/1999 | Jain | 438/687 |
| 5,939,788 | * | 8/1999 | Mc Teer | 438/624 |

FOREIGN PATENT DOCUMENTS

| | | |
|---|---|---|
| 2-143429 | 6/1990 | (JP) . |
| 8-298285 | 11/1996 | (JP) . |
| 9-064034 | 3/1997 | (JP) . |

OTHER PUBLICATIONS

Mikagi et al., "Barrier Metal Free Copper Damascene Interconnection Technology Using Atmospheric Copper Reflow and Nitrogen Doping in SiOF Film," IEEE, pp. 14.5.1 to 14.5.4 (1996).

Hu et al., "Electromigration Drift Velocity in Al–Alloy and Cu–Alloy Lines," J. Electrochem, Soc., vol. 143, No. 3 (1998).

* cited by examiner

Primary Examiner—Jey Tsai
Assistant Examiner—Lynne A. Gurley
(74) Attorney, Agent, or Firm—Robert A. Rodriguez; Joanna P. Gariazzo (57) ABSTRACT

An interconnect (60) is formed overlying a substrate (10). In one embodiment, an adhesion/barrier layer (81), a copper-alloy seed layer (42), and a copper film (43) are deposited overlying the substrate (10), and the substrate (10) is annealed. In an alternate embodiment, a copper film is deposited over the substrate, and the copper film is annealed. In yet another embodiment, an adhesion/barrier layer (81), a seed layer (82), a conductive film (83), and a copper-alloy capping film (84) are deposited over the substrate (10) to form an interconnect (92). The deposition and annealing steps can be performed on a common processing platform.

22 Claims, 6 Drawing Sheets

METHOD FOR FORMING A SEMICONDUCTOR DEVICE

RELATED APPLICATIONS

This is related to U. S. Pat. application Ser. No. 09/022,933, filed Feb. 12, 1998, and assigned to the current assignee hereof.

FIELD OF THE INVENTION

This invention relates generally to semiconductor devices, and more specifically to an interconnect structure in a semiconductor device and its method for formation.

BACKGROUND OF THE INVENTION

Integrated circuits are continuing to be scaled to smaller dimensions by semiconductor device manufacturers. Interconnect process development, specifically inlaid interconnect technology, is an area being investigated in an effort to continue reducing circuit dimensions. However, the reduction in the size of the interconnects results in a corresponding increase in circuit current density and presents problems with respect to electromigration. This can result in an irreversible change in the resistance and reliability of the circuit over time.

Copper is currently being investigated as an alternative to aluminum to overcome problems introduced as a result of increasing current density. Copper offers intrinsic advantages over aluminum, including its lower resistivity and improved electromigration resistance. However, the use of copper as an alternative in advanced interconnect technologies does not totally eliminate the problems of electromigration. As interconnect dimensions continue to shrink, electromigration will continue to be a reliability concern.

In addition, using copper for forming interconnects introduces new problems with respect to reliability. Copper adheres poorly to oxide-containing films and passivating polymers, such as polyimide. This is not only a concern during the formation of vias and interconnects, but also when assembling and packaging completed semiconductor devices. Reliability problems have been reported with respect to adhesion when using essentially pure copper films to form bond pads. Among them include a failure resulting from poor adhesion between the copper bond pad and portions of the passivation film overlying the copper bond pad.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

A conductive interconnect is formed overlying a substrate. In one embodiment, an adhesion/barrier layer, a copper-alloy seed layer, and a copper film are deposited over the substrate and annealed. In an alternate embodiment, a copper-containing film is deposited over the substrate and annealed. In yet another embodiment, an adhesion/barrier layer, a seed layer, a conductive film, and a copper-alloy capping film are deposited over the substrate. The anneal in this embodiment is optionally performed. The deposition and annealing steps can be performed on a common processing platform.

Figure 1:
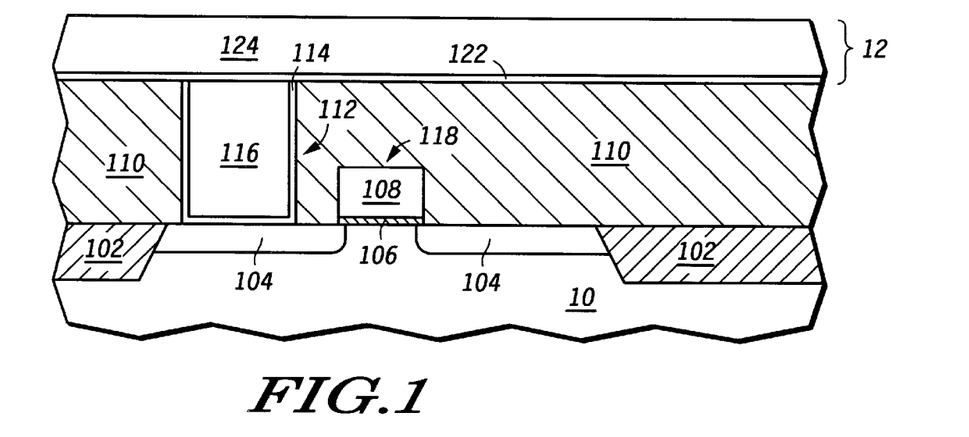
FIG. 1 includes an illustration of a cross-sectional view of a portion of a semiconductor device that has been partially processed to define a first interconnect level.

FIG. 1 includes an illustration of a semiconductor device that has been partially processed to define a first interconnect level. The semiconductor device comprises a semiconductor device substrate 10, field isolation regions 102, a transistor 118, conductive plug 112, and a dielectric layer 110. Transistor 118 includes doped regions 104, a gate dielectric film 106, and a gate electrode 108. As used in this specification, the semiconductor device substrate 10 comprises a monocrystalline semiconductor wafer, a semiconductor-on-insulator substrate, or any other substrate used to form a semiconductor device.

In one embodiment, the gate electrode 108 is a layer of polysilicon. Alternatively, gate electrode 108 can be a metal layer, such as tungsten or molybdenum, a metal nitride layer, such as titanium nitride, tungsten nitride, and a combination thereof. In addition, gate electrode 108 can be a polycide film comprising a metal silicide, such as tungsten silicide, titanium silicide, and cobalt suicide, overlying a polysilicon film.

Following formation of the gate electrode 108, a first interlevel dielectric (ILD) layer 110 is formed over the substrate 10 and patterned to form a contact opening. In one embodiment, first ILD layer 110 is a film of plasma deposited oxide that is formed using tetraethoxysilane (TEOS) as a source gas. Alternatively, first ILD layer 110 can be a film of silicon nitride, a film of phosphosilicate glass (PSG), a film of borophosphosilicate glass (BPSG), a silicon oxynitride film, a polyimide film, a low-k dielectric, or a combination thereof.

Following patterning, a contact opening is formed in the dielectric layer 110. The contact opening comprises a conductive plug 112 that is formed using an adhesion/barrier layer 114, such as titanium/titanium nitride (Ti/TiN) and tantalum/tantalum nitride (Ta/TaN), and a conductive fill material 116, such as tungsten. After being deposited, portions of the conductive fill material 116 and underlying adhesion/barrier layer 114 are removed using a conventional etching or chemical-mechanical polishing technique to form the conductive plug 112. Alternatively, the conductive plug 112 can be formed using doped silicon as a contact fill material with or without the adhesion/barrier layer 114.

After forming the conductive plug 112, a second adhesion/barrier layer 122 and a second conductive film 124 are formed overlying the conductive plug 112 and dielectric layer 110. In one embodiment, the second adhesion/barrier layer 122 is formed using Ta/TaN, and conductive film 124 is formed using copper, aluminum, or the like. The combination of the second adhesion/barrier layer 122 and the second conductive film 124 form a first interconnect level 12. Up to this point in the process, conventional methods have been used to form the device as shown in FIG. 1.

Figure 2:
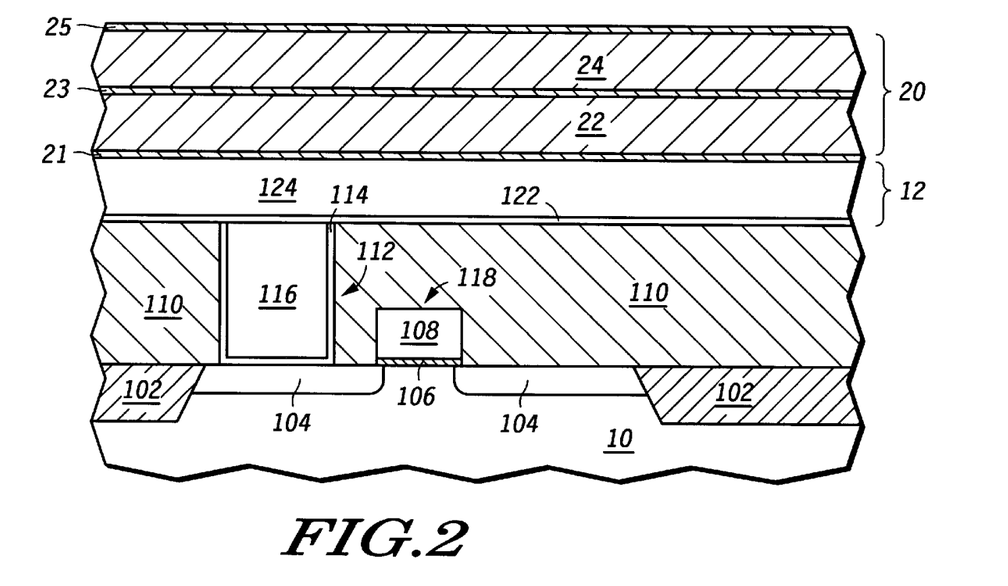
FIG. 2 includes an illustration of a cross-sectional view of the substrate of FIG. 1 after the formation of an adhesion/barrier layer, and an interlevel dielectric film.

A passivation layer 21 is then formed overlying the first interconnect level 12 as is illustrated in FIG. 2. In one embodiment, passivation layer 21 is a film of plasma deposited silicon nitride. Alternatively, passivation layer 21 can be a film of plasma deposited silicon oxynitride, a film of boron nitride, or the like. Passivation layer 21 is used to reduce the likelihood of metal atoms, within the interconnect level 12, from diffusing into dielectric films that are subsequently deposited over the interconnect level 12. For example if interconnect level 12 comprises copper, then passivation layer 21 serves as a copper diffusion barrier.

FIG. 2 further illustrates an interlevel dielectric layer (ILD) 20 formed overlying the adhesion/barrier layer 122. In one embodiment, interlevel dielectric layer 20 comprises dielectric film 22, intermediate etch stop film 23, dielectric film 24, and hardmask film 25.

Dielectric film 22 can be a film of plasma deposited oxide formed using TEOS as a source gas. Alternatively, dielectric film 22 can be a film of PSG, a film of BPSG, an SOG film, a low dielectric constant (low-k) insulator, or the like. For the purposes of this specification, a low-k insulator is a material having a dielectric constant below approximately 3.5. Intermediate etch stop film 23 can be a film of plasma deposited silicon oxynitride. Alternatively, intermediate etch stop film 23 can be a film of plasma deposited silicon nitride, a film of boron nitride, or the like. Dielectric film 24 can be a film of plasma deposited oxide formed using TEOS as a source gas. Alternatively, dielectric film 24 can be a film of PSG, a film of BPSG, an SOG film, a low dielectric constant (low-k) insulator or the like. The interlevel dielectric film 20 need not be formed using different dielectric materials. For example, interlevel dielectric film 20 can be formed using a single dielectric material, such as plasma deposited oxide, PSG, BPSG, SOG, polyimide, a low dielectric insulator, and the like. Overlying the dielectric film 24, is a hardmask film 25. In one embodiment, hardmask film 25 is a film of plasma deposited silicon oxynitride. Alternatively, hardmask film 25 can be a film of plasma deposited silicon nitride, a film of boron nitride, or the like.

Figure 3:
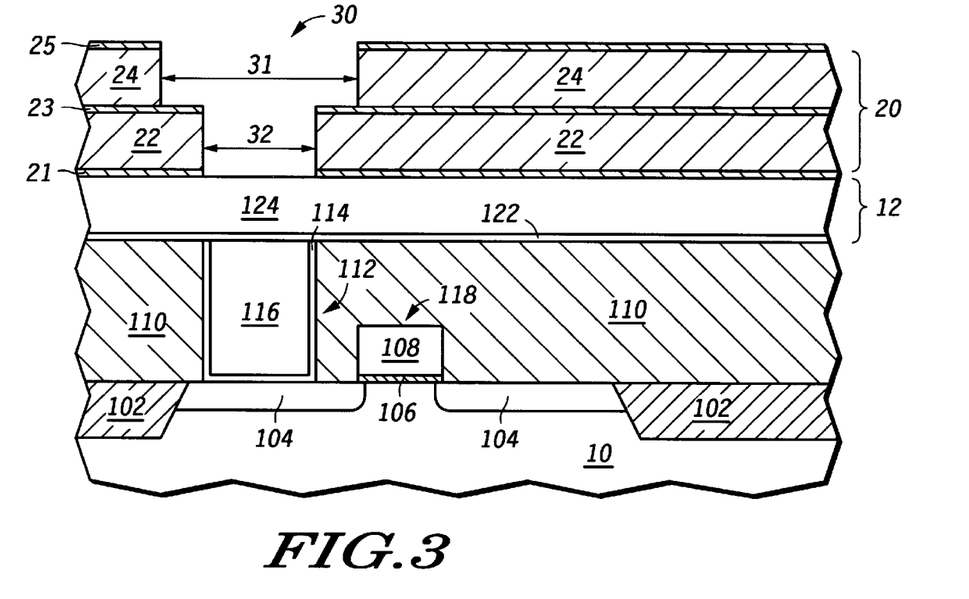
FIG. 3 includes an illustration of a cross-sectional view of the substrate of FIG. 2 after forming a dual inlaid opening within the interlevel dielectric film.

In FIG. 3, a portion of interlevel dielectric layer 20 and passivation layer 21 are patterned to form dual inlaid opening 30. As shown in FIG. 3, dual inlaid opening 30 comprises an interconnect portion 31 and a via portion 32, wherein via portion 32 exposes a portion of conductive interconnect 12. Using a patterning process consistent with via-first trench-last (VFTL) processing, hardmask film 25 protects dielectric film 24 while dielectric film 24 is being etched to define a via opening in etch stop film 23, and etch stop 23 protects dielectric film 22 when forming the interconnect portion of the dual inlaid opening in the dielectric film 24.

Figure 4:
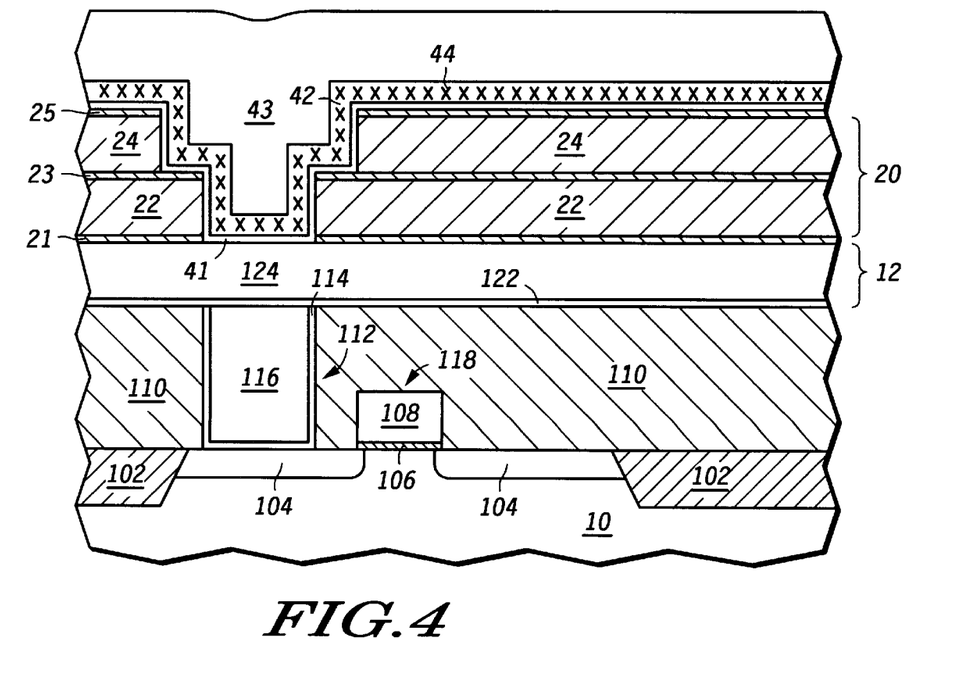
FIG. 4 includes an illustration of a cross-sectional view of the substrate of FIG. 3 after depositing a adhesion/barrier layer, a seed layer, and a conductive film within the dual inlaid opening.

In FIG. 4, an adhesion/barrier layer 41 is formed within dual inlaid opening 30. In one embodiment, the adhesion/barrier layer is a film of tantalum nitride. Alternatively, adhesion/barrier layer 41 can be a film of titanium nitride, a film of tungsten nitride, a film of tantalum silicon nitride, a film of tantalum, a film of titanium tungsten, or the like. The adhesion/barrier layer 41 is typically deposited using conventional sputtering methods. The adhesion/barrier layer 41 can alternatively be formed using collimated sputtering, ionized sputtering, or chemical vapor deposition processes.

A seed layer 42 and a conductive film 43 are then formed overlying the adhesion/barrier layer 41. In one embodiment, the seed layer 42 comprises copper and magnesium. Alternatively, other alloying materials or combinations of alloying materials can be used including indium, tin, chromium, zinc, carbon, zirconium, palladium, titanium, iron, niobium, magnesium, or the like. In alternate embodiments, the seed layer 42 can consist essentially of a single element, such as copper, nickel, tin, or the like.

The methods of forming the seed layer 42 vary. In one embodiment, the seed layer 42 is formed using a physical vapor deposition (PVD) process with a sputtering target comprising approximately two atomic percent magnesium, and approximately ninety-eight atomic percent copper. The seed layer 42 can alternatively be deposited using other PVD deposition processes including ionized PVD, long throw PVD, or collimated PVD, or it can be deposited using a chemical vapor deposition (CVD) process, or a plating process, such as electroless plating or electroplating, or the like. The seed layer 42 is deposited as a continuous film overlying the adhesion/barrier layer 41 and is formed within the dual inlaid opening 30. In one embodiment, the seed layer 42 is deposited at a thickness in a range of approximately 150–250 nanometers. However, those of ordinary skill in the art appreciate that the seed layer must be formed sufficiently thick to allow for adequate plating of the conductive film, and yet thin enough, to prevent excessive lateral build-up of the seed layer 42 over corner edges of the dual inlaid opening 30 and the subsequent formation of voids at the bottom of the dual inlaid interconnect opening (30).

A conductive film 43 is formed overlying the seed layer 42. The conductive film 43 has a thickness that is sufficient to completely fill the dual inlaid opening 30. In one embodiment, the conductive film is copper deposited using conventional electroplating techniques. The copper is plated to a thickness of approximately 600 nanometers, which is approximately 1.5 times the thickness of the trench portion of the dual inlaid opening. Alternatively, the conductive film 43 can be formed by other deposition processes including electroless plating, CVD, PVD, or a CVD plus PVD combination.

Figure 5:
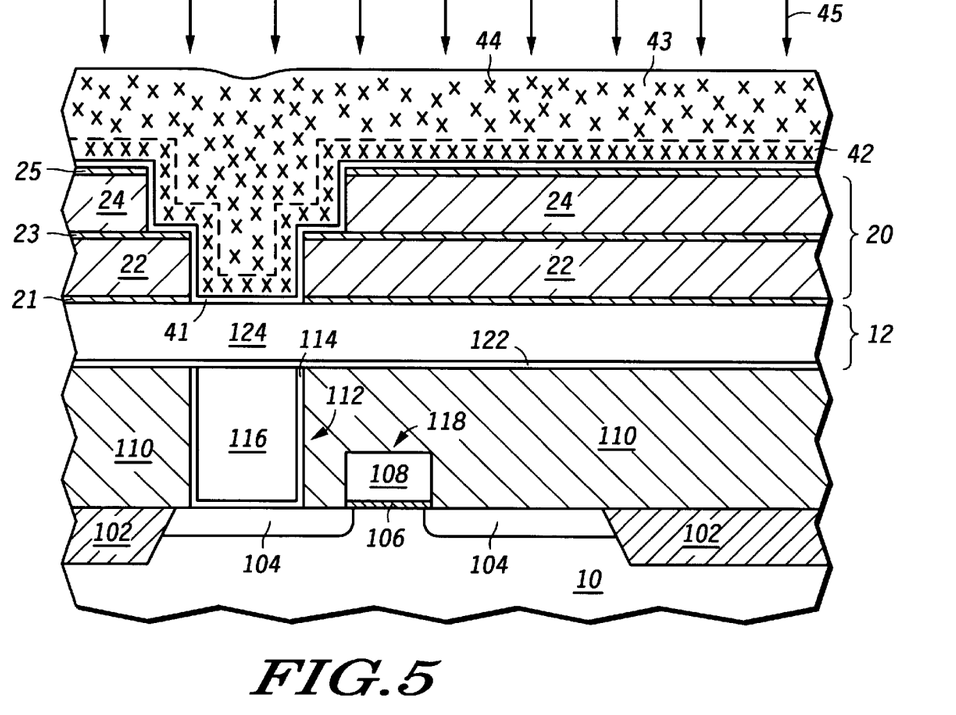
FIG. 5 includes an illustration of a cross-sectional view of the substrate of FIG. 4, and further illustrates a step of annealing to redistribute alloying constituents from the seed layer into the conductive film.

FIG. 5 illustrates the structure of FIG. 4 during an annealing step as indicated by the arrows 45. The annealing step diffuses alloying constituents 44 from the seed layer into the conductive film 43. The diffusion of the alloying constituents 44 from the seed layer 42 to the conductive film 43 results in a redistribution of the alloying constituents 44 throughout the seed layer 42 and the conductive film 43. The redistribution of the alloying constituents 44 can be homogenous throughout the seed layer 42 and the conductive film 43, higher in the seed layer 42, or agglomerated at the surfaces and interfaces of the seed layer 42 and the conductive film 43 depending on the alloying material used and the annealing conditions.

Benefits potentially occur as a result of the anneal and subsequent incorporation alloying constituents 44 into the conductive film 43. These include an improvement in the conductive film's resistance characteristics and its adhesion properties. The anneal changes the seed layer 42 and conductive film 43 surface composition, morphology, and internal microstructure. Sustained temperatures above 300° C. promotes the migration of alloying constituents 44 to the surface and interfaces of conductive film 43. Upon exposure to oxygen atoms, an alloy-oxide film is formed. The alloy-oxide film promotes adhesion between the conductive film 43 and adjacent films, including subsequently deposited passivation layers. In accordance with embodiments where the anneal is used to diffuse the alloying constituents 44, the anneal is performed in a furnace at approximately 300–450° C. for 20 to 30 minutes.

The anneal can alternatively be performed on a non-alloy containing conductive film in order to improve the electromigration reliability of the interconnect. In embodiments where the conductive interconnect is formed using a barrier layer and a conductive film comprising essentially a single material, the substrate can be annealed at approximately 200° C. for approximately five minutes. The substrate can alternatively be annealed in a range of 250–400° C. for at least one minute as a means of improving throughput. The anneal can be performed in a nitrogen, a reducing, or a vacuum ambient to minimize the oxidation of exposed surfaces. In this embodiment, examples of a conductive film comprising essentially a single material include an electroless plated copper seed layer with an electroplated copper film, a CVD deposited copper film, or the like.

Parametric testing, as measured using resistance and electromigration data, indicates that improvements can be achieved as a result of the annealing step. A reduction in the films resistance, an improvement in the film's overall resistance distribution, and an improvement with respect to electromigration performance are attributed to the grain growth and densification of the copper film during the anneal. Prior to annealing, the grain structure and grain orientation of the copper varies throughout the film. Different failure modes, related to the highly variable grain structures and orientations, all contribute to cause electromigration failures. By annealing the copper, the grain structure distribution within the film is more uniform, and the variation in electromigration failures related to these grain structures has a correspondingly tighter distribution.

Benefits achieved as a result of annealing the seed layer and conductive film can correspondingly be obtained by annealing the seed layer prior to depositing the conductive film. This can be performed insitu by depositing the seed layer in a temperature range of approximately 200–400° C. This can also be performed by first depositing the seed layer and then annealing it at a temperature in a range of approximately 200–400° C. for approximately 1–5 minutes, prior to depositing the conductive layer.

In accordance with embodiments of the present invention, the annealing step can be performed using a rapid thermal anneal (RTA), a hot plate, a heated chuck, or a furnace. An annealing station can be integrated into the process flow as part of a cluster tool, in which case, the seed layer deposition step, the conductive film deposition step, a spin-rinse-dry (SRD), and the annealing step, or any combination of these steps can all be performed on a single processing platform. Similarly, these steps can be performed as single wafer or batch wafer processing operations.

Figure 6:
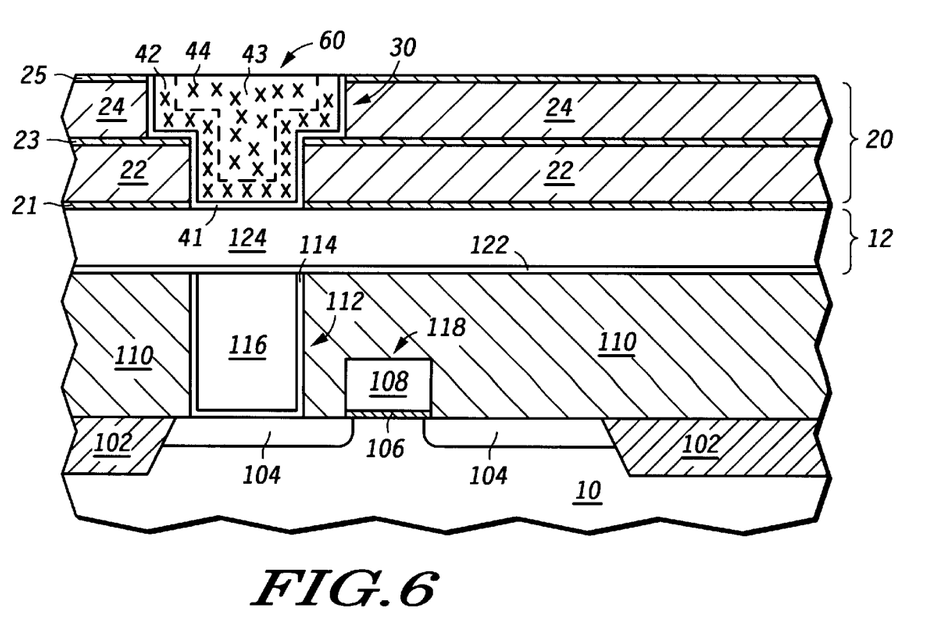
FIG. 6 includes an illustration of a cross-sectional view of the substrate of FIG. 5 after forming a dual inlaid interconnect structure.

In FIG. 6, portions of the conductive film 43, seed layer 42, and adhesion/barrier layer 41 are removed using conventional chemical mechanical polishing processes to form an interconnect 60 within the interconnect opening 30. Alternatively, interconnect 60 can be formed using conventional etching techniques such as ion milling, reactive ion etching, and plasma etching, or using a combination of both etching and polishing techniques.

In embodiments where alloying constituents 44 are diffused from the seed layer 42 into the conductive film 43, the anneal can alternatively be performed after forming the interconnect. In an alternate embodiment, after removing portions of the conductive film 43, the seed layer 42, and the adhesion/barrier layer 41 to form the interconnect, the substrate is annealed in a furnace at approximately 300–450° C. for approximately 20–30 minutes. Relatively inert ambients, such as argon, helium, nitrogen, and the like, can be used during the anneal to reduce the likelihood of oxidizing the dielectric film 24 and the conductive interconnect. During the annealing step, the alloying constituents diffuse from the seed layer 42 into the conductive film 43. The anneal can alternatively be performed using the rapid thermal anneal (RTA), the hot plate anneal, or the furnace anneal processes described previously. This annealing step is different than the anneal previously described in that it is performed after the step of forming the conductive interconnect. However, the final product is a conductive interconnect that provides essentially the same benefits as the interconnect 60 previously described.

Figure 7:
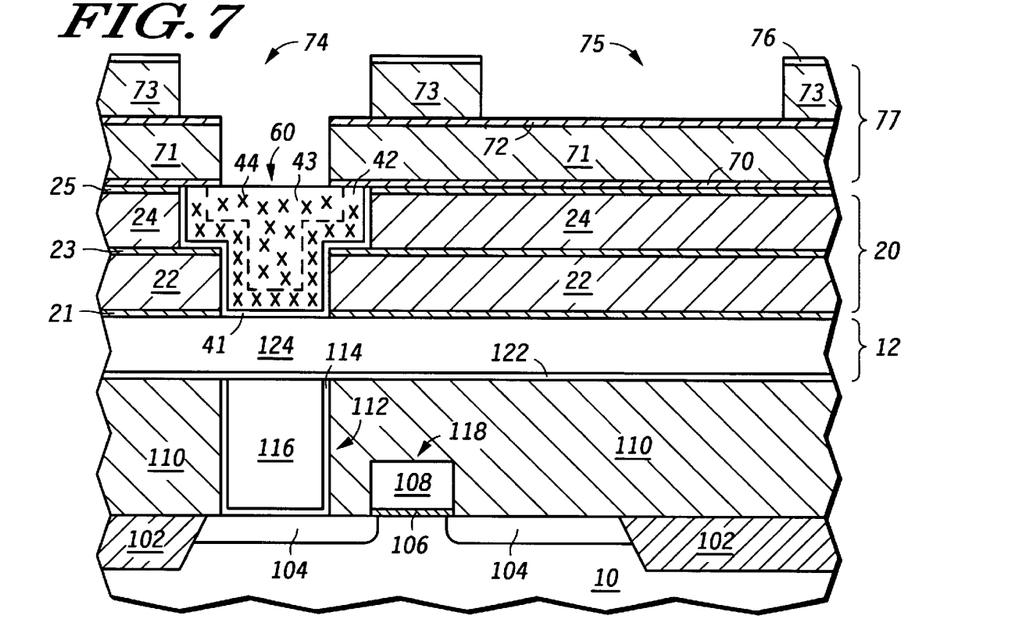
FIG. 7 includes an illustration of a cross-sectional view of the substrate of FIG. 6 after depositing a second interlevel dielectric film, and after forming an upper dual inlaid opening and a single inlaid opening.

FIG. 7 further illustrates the semiconductor device and now includes a passivation layer 70, interlevel dielectric layer (ILD) 77, and hardmask layer 76. ILD layer 77 further includes a lower dielectric film 71, an intermediate etch stop film 72 and an upper dielectric film 73. The passivation layer 70, ILD layer 77, and hardmask layer 76 are formed using methods similar to those used to form passivation layer 21, ILD layer 20, and hardmask film 25. A dual inlaid opening 74 has been formed the hardmask layer 76, ILD layer 77 and passivation layer 70 exposing portions of interconnect 60. Dual inlaid opening 74 is formed using techniques similar to those previously described to form dual inlaid opening 30.

In accordance with an embodiment of the present invention, a single inlaid opening 75 is also formed during the formation of the dual inlaid structure 74. In one embodiment, the single inlaid opening 75 is used to form a bond pad for the semiconductor device. During the etch to define the single inlaid opening 75, the etch stop film 72, which is used to define the interconnect trench portion of the dual inlaid opening 74, also prevents removal of portions of the lower dielectric film 71.

Figure 8:
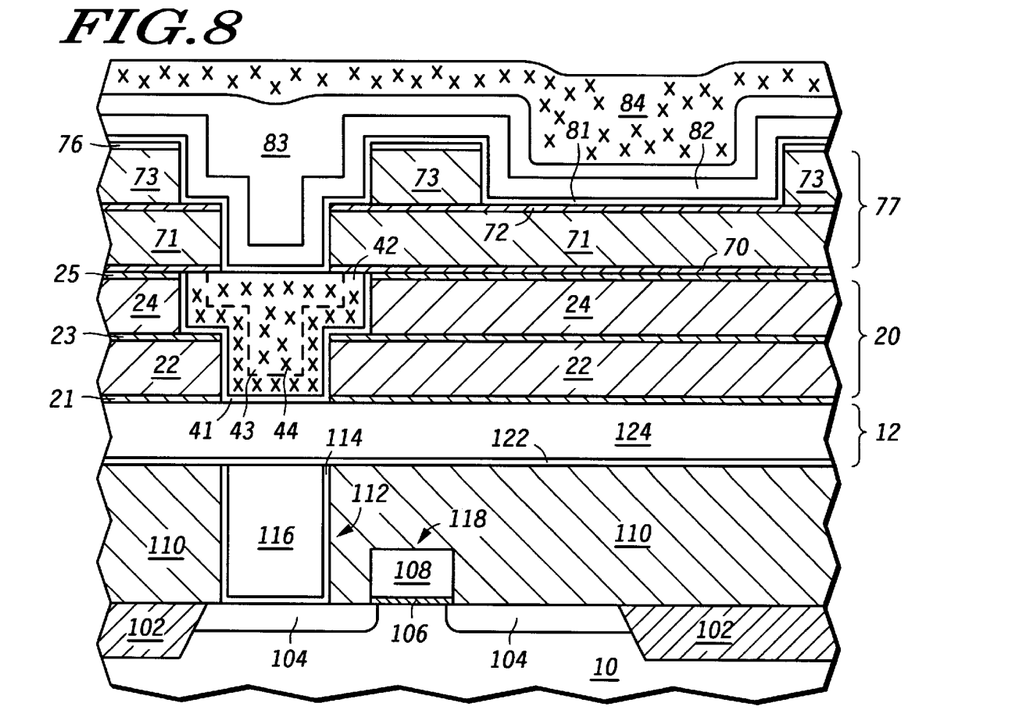
FIG. 8 includes an illustration of a cross-sectional view of the substrate of FIG. 7 after depositing an adhesion/barrier layer, a seed layer, a conductive film, and a conductive alloy capping film overlying the upper dual inlaid opening, and the single inlaid opening.

FIG. 8 further illustrates the semiconductor device substrate and now includes an adhesion/barrier layer 81, a seed layer 82, a conductive film 83 that completely fills the dual inlaid structure and partially fills the single inlaid structure, and a conductive alloy capping film 84. In one embodiment, the adhesion/barrier layer 81 is a film of tantalum nitride and is formed overlying hardmask layer 76 and within both the dual inlaid opening 74 and the single inlaid opening 75 previously defined in FIG. 7. The adhesion/barrier layer 81 can alternatively be a film of tungsten nitride, a film of tantalum silicon nitride, a film of tantalum, a tantalum tungsten film, or the like. Adhesion/barrier layer 81 can be deposited using conventional sputtering or chemical vapor deposition techniques.

Overlying adhesion/barrier layer 81 is a seed layer 82. In this particular embodiment, the seed layer 82 is a copper seed layer and is deposited using a PVD process to a thickness in a range of approximately 150–250 nanometers. The seed layer 82 can alternatively be deposited as a conductive alloy and use other conventional deposition techniques. Examples of alloying materials include indium, tin, chromium, zinc, zirconium, palladium, carbon, titanium, iron, niobium, or the like.

Overlying the seed layer 82 is the conductive film 83. An electroplating process is typically used to form the conductive film 83. In this particular embodiment, the conductive film 83 is a copper film electroplated to a thickness in a range of approximately 300–500 nanometers. The conductive film 83 can alternatively be formed using PVD or CVD processes, and can be formed using other conductive materials such as aluminum, or gold.

In accordance with embodiments of the present invention, the conductive film has a thickness that is sufficient to fill the dual inlaid opening 74 but does not completely fill the single inlaid opening 75.

Referring to FIG. 8, portions of the total thickness of the conductive film 83 lie below the uppermost level of dielectric film 73. The lateral dimensions of the single inlaid opening, which are not drawn to scale, are considerably larger than the dual inlaid opening. For example, the size of the single inlaid opening can be in the range of 25–50 microns across and the size of the dual inlaid opening less than approximately 0.35 microns. The single inlaid 75 opening is only partially filled because it is so wide.

Overlying the conductive film 83 is a conductive alloy capping film 84. In accordance with an embodiment of the present invention, the conductive alloy capping film 84 is a copper magnesium alloy formed over the conductive film 83. The conductive alloy capping film 84 is deposited using a PVD process with a copper magnesium sputtering target containing approximately 2.0 atomic percent magnesium and ninety-eight atomic percent copper. The conductive alloy capping film 84 can alternatively be formed using other conventional deposition techniques and with other alloying materials including indium, tin, chromium, zinc, zirconium, palladium, carbon, titanium, iron, niobium, or the like. As illustrated by FIG. 8. The conductive alloy capping film 84 completely fills portions of the single inlaid structure that are below the top of dielectric film 73. The copper-alloy capping film 84 is deposited so as to completely fill the portion of the single inlaid opening that had been previously left unfilled by the conductive film 83.

The copper-alloy capping film 84 can alternatively be formed using the PVD process previously described, wherein the process temperature is in a range of approximately 300–450° C. The elevated temperature promotes the diffusion of the alloying elements into the conductive film 83, in both the single inlaid structure and the dual inlaid structure, to provide the electromigration and adhesion benefits described previously. The composite copper-alloy capping film 84 and conductive film 83 can alternatively be annealed during a subsequent processing step to obtain a similar overall benefit.

Figure 9:
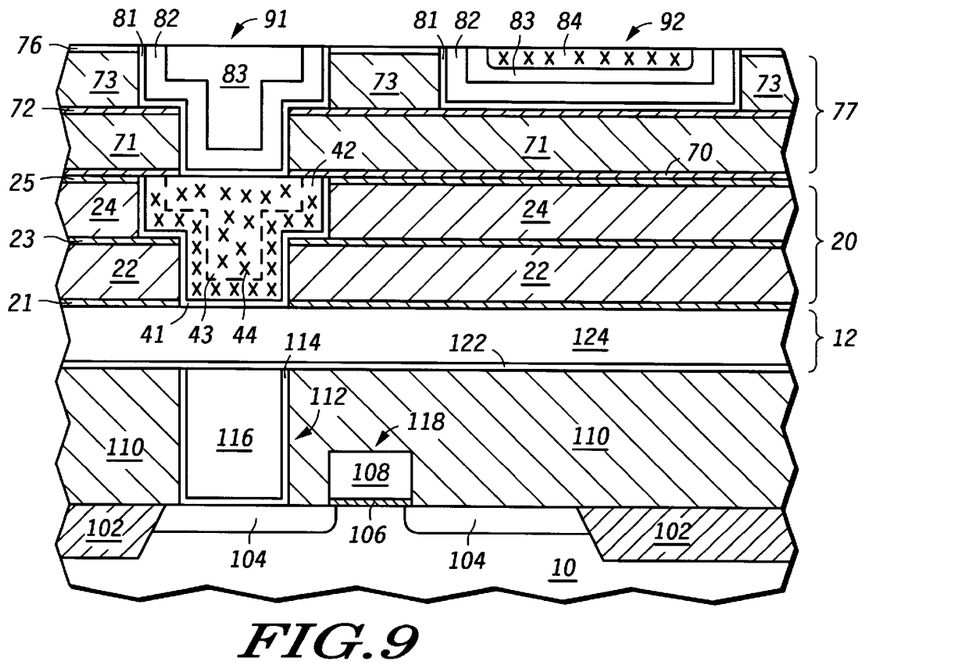
FIG. 9 includes an illustration of a cross-sectional view of the substrate of FIG. 8 after forming a dual inlaid interconnect structure and a bond pad structure.

In FIG. 9 portions of the conductive alloy capping film 84, the conductive film 83, the seed layer 82, and the adhesion/barrier layer 81, have been removed using conventional chemical mechanical polishing processes to form an interconnect 91 within the dual inlaid opening 74 and a bond pad 92 within the single inlaid opening 75. The interconnect 91 and bond pad 92 can alternatively be formed using conventional etching techniques such as ion milling, reactive ion etching, and plasma etching, or using a combination of both etching and polishing techniques.

The conductive interconnect 91 comprises remaining portions of conductive adhesion/barrier layer 81, seed layer 82, and conductive film 83. The bond pad 92 comprises remaining portions of conductive adhesion/barrier layer 81, seed layer 82, conductive film 83, and conductive alloy capping film 84.

Figure 10:
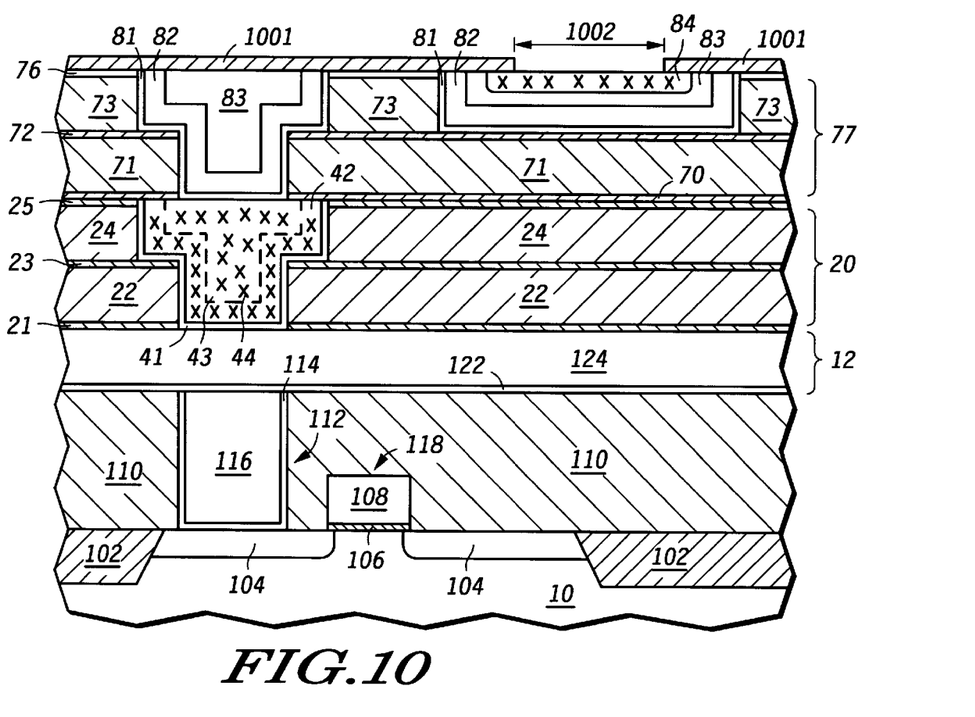
FIG. 10 includes an illustration of a cross-sectional view of the substrate of FIG. 9 after a the formation of a passivation film and an opening in the passivation film exposing portions of the bond pad.

FIG. 10 further illustrates the semiconductor device and now includes an additional passivation layer 1001 overlying portions of the conductive interconnect 91, the hardmask layer 76, and the bond pad 92. In one embodiment, the passivation layer 1001 comprises a 250–350 nanometer silicon oxynitride film overlying a 10–20 nanometer plasma enhanced nitride (PEN) film. As illustrated in FIG. 10, the passivation layer 1001 has been etched to form lower opening 1002 that exposes a portion of the bond pad 92. The passivation film is etched using conventional plasma or wet etch processing techniques.

Figure 11:
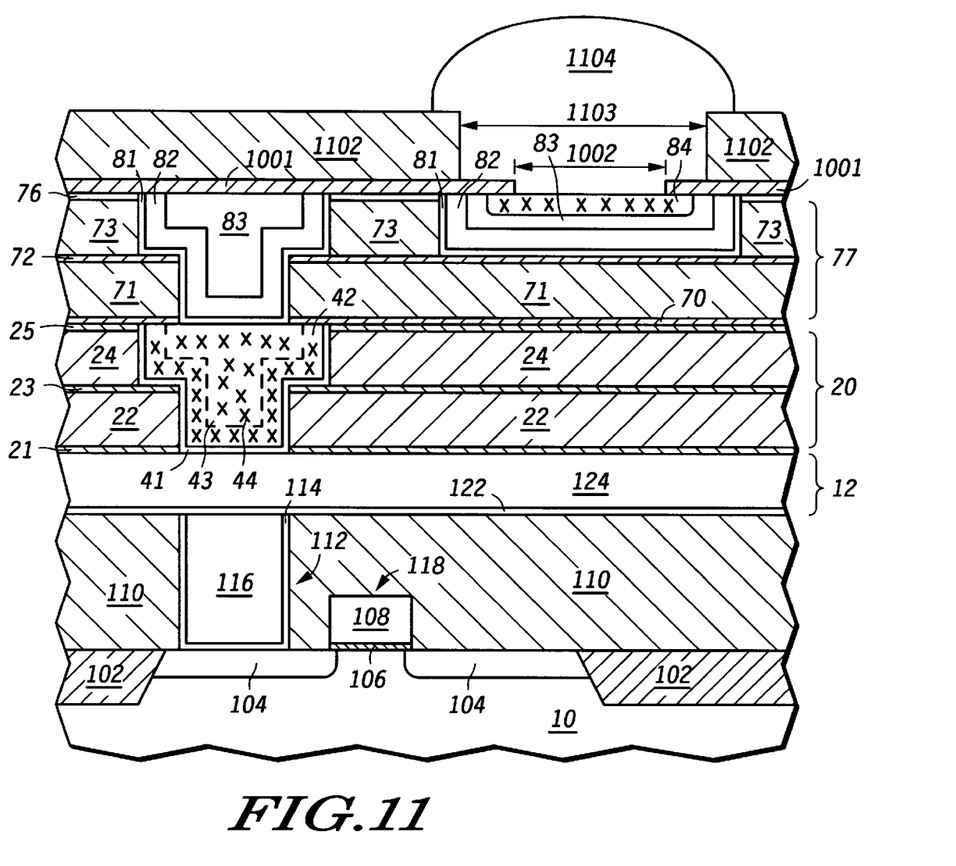
FIG. 11 includes an illustration of a cross-sectional view of the substrate of FIG. 10 after forming a substantially completed device.

FIG. 11 further illustrates the semiconductor device and now includes a polyimide film 1102 overlying the passivation layer 1001. In one embodiment, the polyimide film is formed using a conventional spin-on process and is deposited to a thickness of in a range of approximately 2.5–3.5 microns. An upper opening 1103 is then formed in the polyimide film using conventional processing. In accordance with embodiments of the present invention, and as illustrated in FIG. 11, the upper opening 1103 is larger than the lower opening 1002. These dimensions are dictated by the design and packaging requirements of the semiconductor device and the processes and equipment used to form the opening. Portions of the passivation film 1001 extend to and overlie portions of the conductive alloy capping film 84 within the bond pad 92. A conductive interconnect bump 1104 is then formed overlying the bond pad 92 and portions of the passivation film. The conductive bump 1104 will subsequently provide a connection from the semiconductor device to a semiconductor package.

The presence of the conductive alloy capping film 84 improves the adhesion of the passivation film to the bond pad at the passivation film/bond pad interface. Portions of the conductive interconnect bump 1104 that overlie portions of the passivation film 1101 are less likely to delaminate at the passivation film/bond pad interface. Therefore, die bond reliability is improved as a result of the presence of the alloy capping film 84. This improves the overall reliability of the semiconductor device.

Thus, it is apparent that there has been provided in accordance with the embodiments of the present invention, at least three benefits described over the prior art. These benefits include an improvement in the resistance distribution of the conductive interconnects, an improvement electromigration performance of metal interconnects, and an improvement in the adhesion characteristics of interconnects with respect to overlying and abutting films.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described above with regard to specific embodiments. However, the benefits, advantages, solutions to problems, and any element (s) that can cause any benefit, advantage, or solution to occur or become more pronounced are not to be construed as a critical, required, or essential feature or element of any or all the claims.

What is claimed is:

1. A method for forming a semiconductor device comprising:

forming a barrier layer over a substrate;

forming a seed layer on the barrier layer, wherein the seed layer includes a copper alloy;

forming a conductive film over the seed layer; and annealing the substrate after forming the conductive film over the seed layer, wherein annealing diffuses alloying constituents from the seed layer into the conductive film.

2. The method of claim 1, wherein the copper alloy includes magnesium.

3. The method of claim 1, wherein the copper alloy includes elements selected from a group consisting of indium, chromium, palladium, titanium, iron, carbon, niobium, zirconium, and tin.

4. The method of claim 1, wherein annealing is performed at a temperature in a range of approximately 300–450° C.

5. The method of claim 1, wherein the conductive film includes copper.

6. The method of claim 1, further comprising forming a passivation film over the substrate.

7. A method for forming a semiconductor device comprising:

forming a barrier layer over a substrate, wherein the substrate has a first opening in a dielectric film and the dielectric film has a first top surface;

forming a copper-containing film overlying the barrier layer;

forming a copper-alloy capping film overlying the copper-containing film; and removing portions of the barrier layer, the copper-containing film, and the copper-alloy capping film, to define a first inlaid structure, wherein the first inlaid structure has a second top surface, and wherein the second top surface is substantially planar with the first top surface and includes portions of the copper-alloy capping film.

8. The method of claim 7, wherein the copper-containing film comprises a seed layer.

9. The method of claim 7, wherein the copper-alloy capping film includes magnesium.

10. The method of claim 7, wherein the copper-alloy capping film includes elements selected from a group consisting of indium, chromium, palladium, titanium iron, carbon, niobium, zirconium, and tin.

11. The method of claim 7, further comprising a second opening, wherein the second opening is smaller than the first opening, and wherein forming the copper-containing conductive film substantially fills the second opening.

12. The method of claim 7, further comprising:

forming a passivation layer overlying the first inlaid structure;

forming an opening in the passivation layer to expose portions of the first inlaid structure; and forming an interconnect overlying and contacting portions of the first inlaid structure.

13. The method of claim 12, wherein portions of the passivation layer overlie portions of the copper-alloy capping film.

14. The method of claim 12, wherein the passivation layer includes an oxide containing film.

15. The method of claim 12, wherein the passivation layer includes a material selected from a group consisting of silicon nitride and polyimide.

16. The method of claim 7, wherein forming the copper-alloy capping film includes using a physical vapor deposition (PVD) process.

17. The method of claim 7, wherein forming the copper-alloy capping film performed at a temperature in a range of approximately 300–450° C.

18. The method of claim 7, further comprising annealing the substrate at a temperature in a range of approximately 300–450° C. after forming the copper-alloy capping film and prior to forming a passivation layer over the substrate.

19. A method for forming a semiconductor device comprising:

forming a carbon-containing copper film over a substrate and within an opening; and annealing the carbon-containing copper film.

20. The method of claim 19, wherein annealing is performed at a temperature in a range of approximately 250–400° C. for at least approximately one minute.

21. The method of claim 19, wherein annealing is performed at a temperature in a range of approximately 150–250° C. for at least approximately five minutes.

22. The method of claim 19, wherein forming the carbon-containing copper film and annealing the carbon-containing copper film occur during a same processing step.

* * * * *

UNITED STATES PATENT AND TRADEMARK OFFICE
CERTIFICATE OF CORRECTION

PATENT NO. : 6,218,302 B1
DATED : April 17, 2001
INVENTOR(S) : Gregor Braeckelmann et al.

It is certified that error appears in the above-identified patent and that said Letters Patent is hereby corrected as shown below:

Column 10, claim 17,
Line 33, after the word "film" insert -- is --.

Signed and Sealed this

Thirteenth Day of November, 2001

Attest:

*Attesting Officer*

NICHOLAS P. GODICI
*Acting Director of the United States Patent and Trademark Office*